US007308494B1

(12) United States Patent
Drew et al.

(10) Patent No.: US 7,308,494 B1
(45) Date of Patent: Dec. 11, 2007

(54) REPROVISIONING TECHNIQUE FOR AN INTERCONNECT FABRIC DESIGN

(75) Inventors: Julie Ward Drew, Redwood City, CA (US); Troy Alexander Shahoumian, Sunnyvale, CA (US); John Wilkes, Palo Alto, CA (US); Michael O'Sullivan, Auckland (NZ); Dirk Beyer, Walnut Creek, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 649 days.

(21) Appl. No.: 10/290,760

(22) Filed: Nov. 8, 2002

Related U.S. Application Data

(63) Continuation-in-part of application No. 10/058,258, filed on Jan. 25, 2002, now abandoned.

(51) Int. Cl.
*G06F 15/173* (2006.01)
*G06F 11/00* (2006.01)
*H04B 3/20* (2006.01)

(52) U.S. Cl. ............... 709/223; 370/217; 370/232; 370/238

(58) Field of Classification Search .............. None
See application file for complete search history.

(56) References Cited

U.S. PATENT DOCUMENTS

| 5,802,286 | A  | * | 9/1998 | Dere et al. ............ 709/220 |
| 6,061,331 | A  | * | 5/2000 | Conway et al. ......... 370/232 |
| 6,275,470 | B1 | * | 8/2001 | Ricciulli ............... 370/238 |
| 2002/0122421 | A1 | * | 9/2002 | Ambiehl et al. ........ 370/391 |
| 2004/0010577 | A1 | * | 1/2004 | Yegenoglu ............. 709/223 |

OTHER PUBLICATIONS

U.S. Appl. No. 10/058,258, filed Jan. 25, 2002, Ward et al.
U.S. Appl. No. 09/707,227, filed Nov. 6, 2000, Ward.
U.S. Appl. No. 09/968,437, filed Sep. 28, 2001, O'Sullivan et al.
U.S. Appl. No. 10/027,564, filed Jun. 27, 2002, Ward et al.
J. Ward, M. O'Sullivan, T. Shahoumian and J. Wilkes. Appia: automatic storage area network fabric design. Conference on File and Storage Technologies (FAST'02), pp. 203-217, Monterey, CA (USENIX, Berkeley, CA), Jan. 28-30, 2002.
S. Strand. Storage Area Networks and SANTK. Thesis Universiy of Minnesota, Dec. 2001.
M. O'Keefe, J. Diehl, K. Duncan, G. Heintz, J. Jones, S. McKenzie, J. Prusi, S. Strand, J. Wachholz. Designing Fibre Channel Storage Area Networks. w w w .borg.umn.edu/fc/papers/SANTK.pdf, file created in February of 2001.

(Continued)

*Primary Examiner*—Wen-Tai Lin

(57) ABSTRACT

A technique is disclosed for reprovisioning an interconnect fabric design for interconnecting a plurality of network nodes. A design for the interconnect fabric specifies an arrangement of elements of the fabric and flow requirements among the network nodes. The invention programmatically reprovisions the design. This may include determining whether the flow requirements are satisfied by the design and whether the design violates constraints on the elements, such as bandwidth capacity and number of available ports. If the design does not satisfy the flow requirements, then the design is modified until the flow requirements are satisfied. Modifications are performed systematically by first attempting those that are least disruptive to the design and, then, attempting modifications that are increasingly more disruptive. As a result, the design is efficiently and cost-effectively reprovisioned to meet the flow the requirements.

4 Claims, 11 Drawing Sheets

OTHER PUBLICATIONS

R. Fourer, D. Gay and B. Kernighan. AMPL: Modeling Language For Mathematical Programing with AMPL Plus 1.6 Student Edition for Microsoft Windows. Duxbery Press, Belmont, CA, 1997.

R. Fourer, D. Gay and B. Kernighan. AMPL: Modeling Language For Mathematical Programing. Boyd & Fraser Publishing Company, Danvers, MA, 1993.

R. Bixby. Solving Real-World Linear Programs: A Decade and more of Progress, Operations Research, vol. 50, No. 1, Jan.-Feb. 2002, pp. 3-15.

R. K. Ahuja, T. L. Magnanti, J. B. Orlin. Network Flows: Theory, Algorithims, and Applications. Prentice Hall, 1993, pp. 4-9,649-686.

S. Strand. Automatic Generation of Core/Edge Topology SANs Using SANTK. May 23, 2002.

* cited by examiner

REPROVISIONING TECHNIQUE FOR AN INTERCONNECT FABRIC DESIGN

This application is a continuation-in-part of U.S. application Ser. No. 10/058,258, filed Jan. 25, 2002, now abandoned, the entire contents of which are hereby incorporated by reference.

This application is related to U.S. application Ser. No. 10/290,643, filed, Nov. 8, 2002, and entitled "INTEGER PROGRAMMING TECHNIQUE FOR VERIFYING AND REPROVISIONING AN INTERCONNECT FABRIC DESIGN," now U.S. Pat. No. 7,237,020, the entire contents of which are hereby incorporated by reference.

FIELD OF THE INVENTION

The present invention relates to the field of networks. More particularly, this invention relates to verification and reprovisioning of designs for networks.

BACKGROUND OF THE INVENTION

An interconnect fabric provides for communication among a set of nodes in a network. Communications originate within the network at a source node and terminate at a terminal node. Thus, a wide variety of networks may be viewed as a set of source nodes that communicate with a set of terminal nodes via an interconnect fabric. For example, a storage area network may be arranged as a set of computers as source nodes which are connected to a set of storage devices as terminal nodes via an interconnect fabric that includes communication links and devices such as hubs, routers, switches, etc. Devices such as hubs, routers, switches, etc., are hereinafter referred to as interconnect devices. Depending on the circumstances, a node may assume the role of source node with respect to some communications and of terminal node for other communications. In some instances, a node may play a source or destination role (or both) and act as an internal interconnect device.

The communication requirements of an interconnect fabric may be characterized in terms of a set of flow requirements. A typical set of flow requirements specifies the required communication bandwidth from each source node to each terminal node. The design of an interconnect fabric usually involves selecting the appropriate arrangement of physical communication links, interconnect devices, and related components that will meet the flow requirements.

Once a design of an interconnect fabric has been obtained, it may be desired to reprovision the design to meet communication requirements other than those for which the design was originally developed. For example, the communication requirements for a design may change over time. In addition, it may be desired to use an existing interconnect fabric design for a different application. Prior methods for reprovisioning an interconnect fabric design based on manual techniques are usually error prone and time-consuming.

Therefore, what is needed is an improved technique for reprovisioning the design of a network. It is to these ends that the present invention is directed.

SUMMARY OF THE INVENTION

A technique is disclosed for reprovisioning an interconnect fabric design for interconnecting a plurality of network nodes. A design for the interconnect fabric specifies an arrangement of elements of the fabric and flow requirements among the network nodes. The invention programmatically reprovisions the design. This may include determining whether the flow requirements are satisfied by the design and whether the design violates constraints on the elements, such as bandwidth capacity and number of available ports. If the design does not satisfy the flow requirements, then the design is modified until the flow requirements are satisfied. Modifications are performed systematically by first attempting those that are least disruptive to the design and, then, attempting modifications that are increasingly more disruptive. As a result, the design is efficiently and cost-effectively reprovisioned to meet the flow the requirements.

In one embodiment, a computer implemented method is provided for reprovisioning an initial design for an interconnect fabric thereby forming a reprovisioned design. The initial design includes an arrangement of interconnect elements for interconnecting a plurality of network nodes. The reprovisioned design has requirements for a plurality of flows among the network nodes. For each of the plurality of flows, an attempt is made to associate each flow with a feasible path for the flow through the interconnect fabric. For each flow that is not successfully associated with any feasible path, an attempt is made to add a new link or interconnect device to the interconnect fabric design for accommodating the flow.

Attempting to add a link for a flow may include searching for available ports that are reachable from a source node for the flow via feasible paths in the interconnect fabric and searching for available ports that are reachable from a terminal node for the flow via feasible paths in the interconnect fabric. A pair of available ports including one of the available ports that is reachable from the source node for the flow and one of the available ports that is reachable from the terminal node for the flow may be selected and the new link may be added between the selected available ports.

Selecting a pair of the available ports for the flow may include computing a product of the number of available ports that are reachable from the source node for the flow and the number of available ports that are reachable from the terminal node for the flow. The product indicates the number of possible links for accommodating the flow. A number of possible links for accommodating each of a plurality of flows that are not successfully associated with any feasible path may be computed. Selecting from among the plurality of flows that are not successfully associated with any feasible path may be performed according to the number of possible links computed for each flow (e.g., by accommodating flows with the fewest options first).

The method may include attempting to add an interconnect device for a flow that is not successfully associated with any feasible path. An attempt to add a feasible interconnect device may include identifying a link at a node or interconnect device for which a port is needed for accommodating the flow and replacing the link with an interconnect device that has an available port. A new link may be added for the flow that is connected to the available port of the interconnect device.

When attempts to modify the original design are unsuccessful at accommodating all the flows the interconnect fabric may be redesigned. For redesigning the fabric, a cost may be assigned to elements of the original interconnect fabric that is lower than a cost assigned to alternative elements not included in the initial design for the interconnect fabric.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION OF A PREFERRED EMBODIMENT

The present invention is a technique for reprovisioning an interconnect fabric design. Requirements for the interconnect fabric design to be reprovisioned may be referred to as flow requirements. The flow requirements may include, for example, source and terminal nodes for communication flows and communication bandwidth required for the flows. An existing interconnect fabric design specifies an arrangement of elements of the fabric, such as links and interconnect devices. The invention programmatically reprovisions the existing design to satisfy the flow requirements. If the design does not satisfy the flow requirements, the design is modified until the flow requirements are satisfied. Modifications are performed systematically by first attempting those that minimize disruption to the design and, then, attempting modifications that are increasingly more disruptive. As a result, the design is efficiently and cost-effectively reprovisioned to meet the flow requirements.

The technique is applicable to any network in which communications originate at a source node and terminate at a terminal node, including networks in which a node assumes the role of source node with respect to some communications, the role of terminal node for other communications and/or the role of interconnect device for some communications. As a particular example, a storage area network (SAN), such as a fibre-channel SAN, may be arranged as a set of computers as source nodes which are connected to a set of storage devices as terminal nodes via an interconnect fabric that includes communication links (e.g., fibres) and devices such as hubs, routers, switches, port adapters (e.g., Fibre Channel to PCI), etc.

Because the technique is systematic, it is adaptable to be executed by a computer. Thus, much larger design problems can be solved than can be solved by hand. The technique can be used to reprovision existing fabric designs efficiently and cost-effectively.

Figure 1:
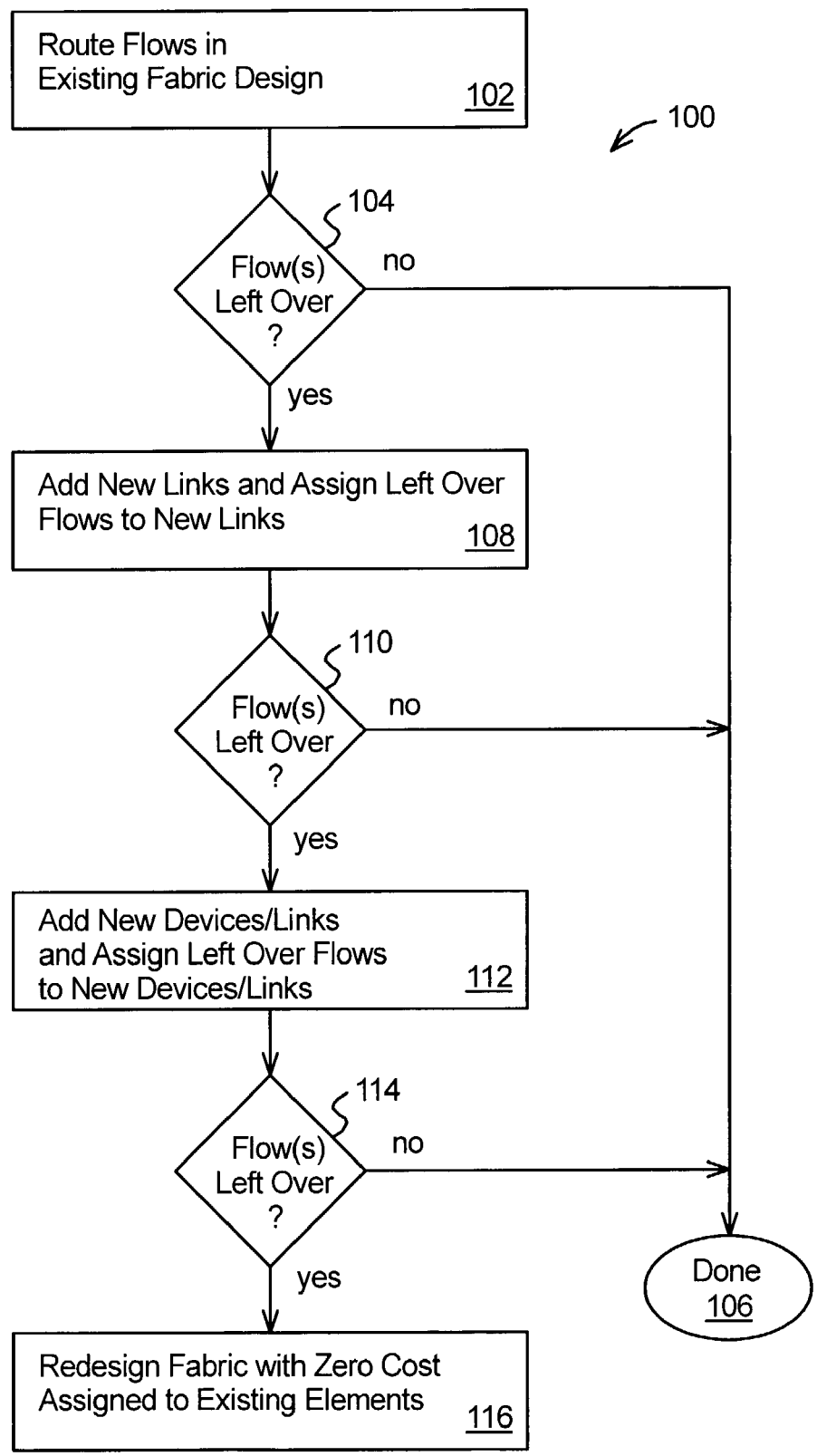
FIG. 1 shows a method for reprovisioning a design for an interconnect fabric in accordance with an aspect of the present invention.
Figure 2:
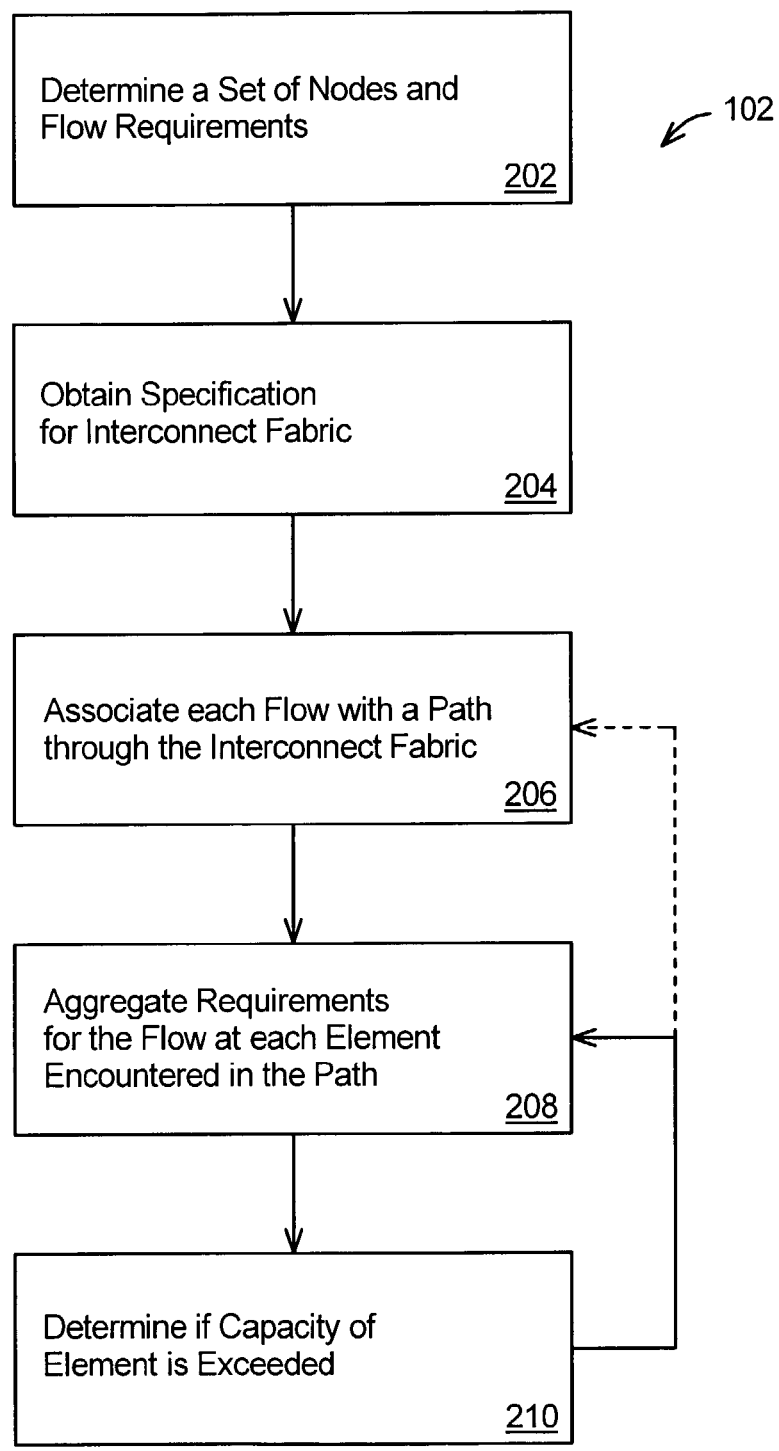
FIG. 2 shows a method for assigning flows to a design for an interconnect fabric according to an aspect of the present invention.

FIG. 1 shows a method 100 for reprovisioning a design for an interconnect fabric in accordance with an aspect of the present invention. At step 102, communication flows are associated with paths within the interconnect fabric of the existing design. If all of the flows can be assigned to the interconnect fabric and their requirements simultaneously met, this indicates that modifications are not necessary to reprovision the fabric design for supporting the new or changed set of flow requirements. Perhaps more typically, one or more of the flow requirements cannot be satisfied by the existing fabric design. This indicates that modifications are required in order to reprovision the fabric design for supporting the flow requirements. FIG. 2 illustrates an embodiment of step 102 in more detail.

Referring to FIG. 2, at step 202, a set of network nodes, such as source and terminal nodes, that are interconnected by the interconnect fabric design are determined. In addition, flow requirements that are to be supported by the fabric are determined. These will generally be a different or changed set of flow requirements from those that the interconnect fabric was originally designed to support. Table 1 shows an example set of flow requirements for an interconnect fabric design.

|  | Terminal Node 20 | Terminal Node 22 | Terminal Node 24 |
|---|---|---|---|
| Source Node 10 | a | b | c |
| Source Node 12 | d | e | f |
| Source Node 14 | — | g | h |

The flow requirements in this example specify three source nodes (source nodes 10-14 in the figures below) and three terminal nodes (terminal nodes 20-24 in the figures below). For the interconnect fabric design to meet the flow requirements, it must contain communication paths between all pairs of the source nodes 10-14 and terminal nodes 20-24 having positive flow requirements and must have sufficient bandwidth to support all of the flow requirements simultaneously.

In one embodiment, the source nodes 10-14 are host computers and terminal nodes 20-24 are storage devices and the bandwidth values for flows a-h are numbers expressed in units of megabits per second. Thus, the interconnect fabric design may be for a storage area network.

In other embodiments, there may be multiple flow requirements between a given source and terminal node pair. In such embodiments, the cells of Table 1 may contain a list of two or more entries.

Figure 3:
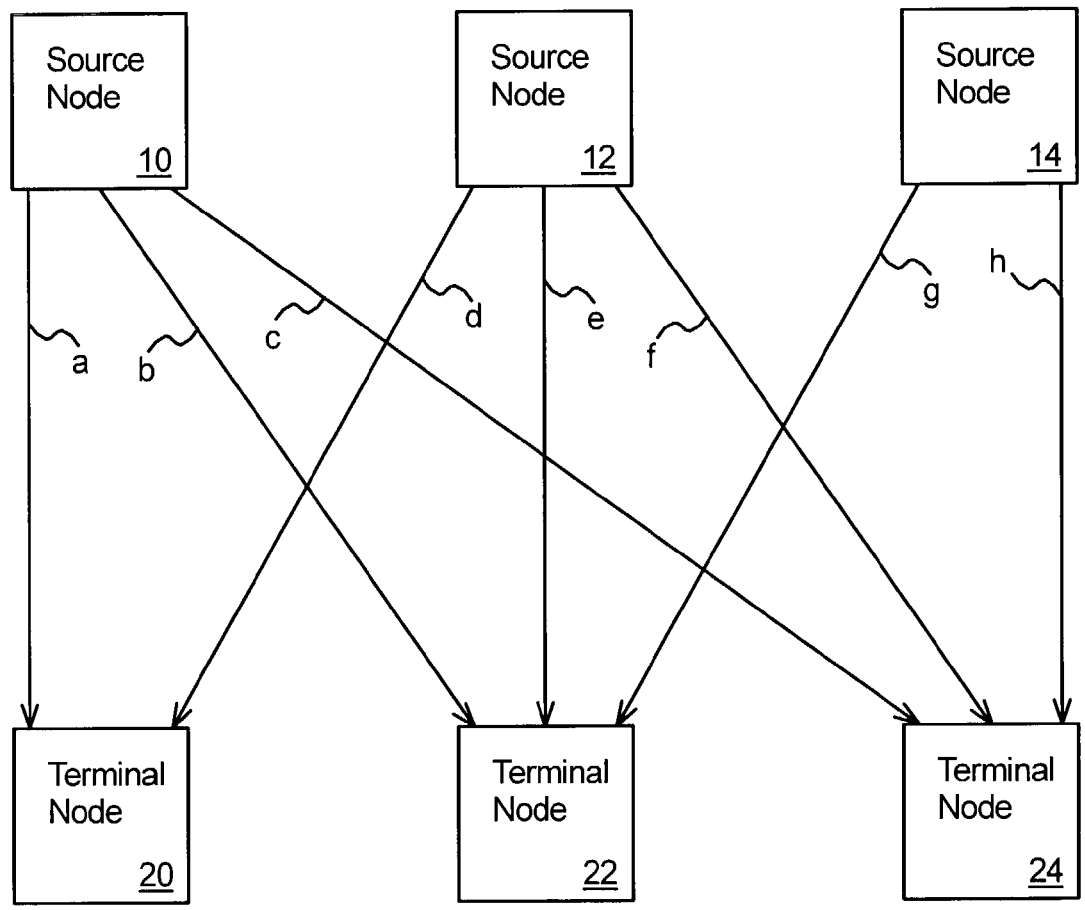
FIG. 3 shows an arrangement of flows for an exemplary interconnect fabric design.

FIG. 3 shows an arrangement of flows in the interconnect fabric design obtained at step 202 for this example. Accordingly, a flow a forms a connection between the source node 10 and the terminal node 20, a flow b forms a connection between the source node 10 and the terminal node 22, and a flow c forms a connection between the source node 10 and the terminal node 24. Similarly, flows d, e, and f, respectively, form connections from the source node 12 to the terminal nodes 20-24 and flows g and h, respectively, form connections from the source node 14 to the terminal nodes 22-24.

Because the set of nodes and the flow requirements are the basic constraints for the interconnect fabric, they may be used as a starting point for reprovisioning the design. For example, the set of nodes and the flow requirements may be indicated by the applications that the design to be reprovisioned is intended to support. Some of this information may be obtained, for example, from the existing design with the remainder determined based on changes to the workload that is to be supported by the reprovisioned design. Accordingly, the set of nodes and flow requirements will generally be readily available.

In a step 204, a specification of the existing interconnect fabric design which is to be reprovisioned by the present invention is obtained. Typically, the design specifies at least a set of interconnect devices and communication links. The devices may include for example, hubs, routers, switches, and so forth. The links form physical connections among the nodes and the interconnect devices. These may include, for example, fiber optic links, fibre channel links, wire-based links, and links such as SCSI, as well as wireless links. For example, U.S. application Ser. No. 09/707,227, filed Nov. 6, 2000, the contents of which are hereby incorporated by reference, discloses a technique for designing interconnect fabrics using a set of nodes and flow requirements as a starting point. It will be apparent, however, the present technique may be used to reprovision interconnect fabric designs obtained by other techniques, such as manual or other methods.

Figure 4:
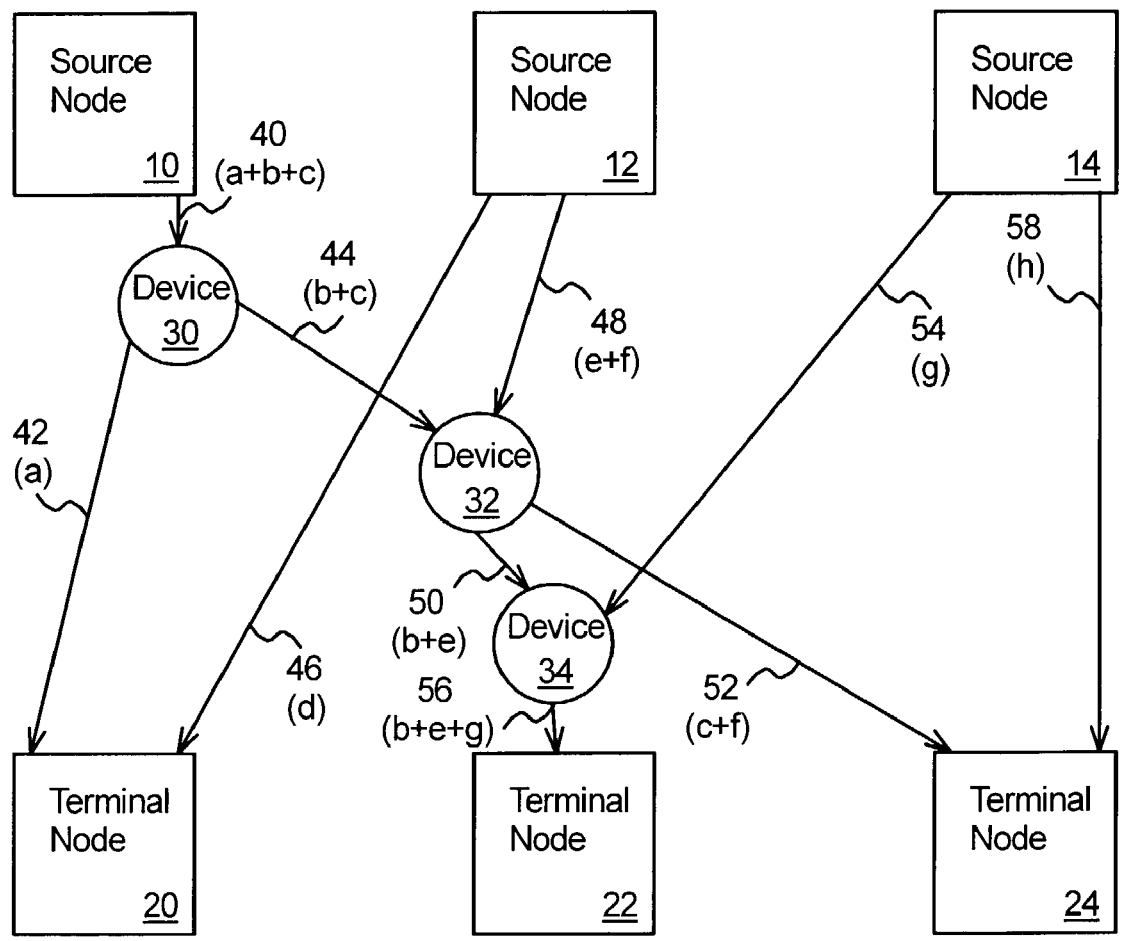
FIG. 4 shows an exemplary design specification for an interconnect fabric to be reprovisioned according to an aspect of the present invention.

FIG. 4 shows an exemplary existing design specification that is to be reprovisioned for supporting the example flow requirements. The design of FIG. 4 may be developed by the technique of U.S. application Ser. No. 09/707,227, mentioned above, or by another technique. As shown in FIG. 4, devices 30, 32, and 34 and a set of links 40-58 interconnect the nodes 10-14 and 20-24. More particularly, a port of the source node 10 is connected to the device 30 by a link 40. The device 30 is connected to the terminal node 20 by a link 42. The device 30 is connected to the device 32 by a link 44. The source node 12 is connected to the terminal node 20 by a link 46. The source node 12 is connected to the device 32 by a link 48. The device 32 is connected to the device 34 by a link 50. The device 32 is connected to the terminal node 24 by a link 52. The source node 14 is connected to the device 34 by a link 54. The device 34 is connected to the terminal node 22 by a link 56. The source node 14 is connected to the terminal node 22 by a link 58. Rather than being represented graphically, as in FIG. 4, the design specification may be represented other ways. For example, the design specification may be in the form of a list including elements and connections between the elements.

In a step 206, each flow included in the flow requirements obtained in the step 202 is associated with a path through the interconnect fabric. One or more of these associations of flows to paths may be indicated by the existing design specification, particularly where the design was intended to support an original set of flow requirements that have increased or otherwise changed but also retain some common elements. In these circumstances, an attempt may be made to associate flows existing before and after the change with their original path in the fabric. Alternately, these associations may be developed in step 206 by comparing each flow to the design for the interconnect fabric and identifying a path through the fabric whose end points match those of the flow. To be a valid path for a flow, the path should start at the source node for the flow, terminate at the end node for the flow and pass through a contiguous subset of the links and devices identified in the step 204.

In some cases, there may be more than one possible path for the flow. In which case, the flow may be assigned to one such path and an attempt made to verify the design based on that assignment (steps 208-210, discussed below). If the design cannot be verified, the flow may be assigned to another possible path. Flows may be assigned to new paths until the design can be verified or all the possible paths for all flows have been tried unsuccessfully. Assignment of flows to the fabric may be accomplished using a bin-packing problem solution process.

If a valid path cannot be identified for a flow in step 206, this indicates that the design will not meet the flow requirements. If the design is rejected in step 206 because it does not include a valid path for each flow, it may then be modified as explained herein to add one or more valid paths as needed, or to add one or more interconnect devices and associated links or a new design may be developed.

In the example, each of the flows a-h from FIG. 3 may be associated with a corresponding path through the interconnect fabric of FIG. 4. Thus, flow a is associated with a path from the source node 10, through link 40, device 30 and link 42, terminating at terminal node 20. Flow b is associated with a path from the source node 10, through link 40, device 30, link 44, device 32, link 50, device 34, and link 56, terminating at terminal node 22. Flow c is associated with a path from the source node 10, through link 40, device 30, link 44, device 32 and link 52, terminating at terminal node 24. Flow d is associated with a path from the source node 12, through link 46 and terminating at terminal node 20. Flow e is associated with a path from the source node 12, through link 48, device 32, link 50, device 34 and link 56, terminating at terminal node 22. Flow f is associated with a path from the source node 12, through link 48, device 32 and link 52, terminating at terminal node 24. Flow g is associated with a path from the source node 14, through link 54, device 34 and link 56, terminating at terminal node 22. Flow h is associated with a path from the source node 14, through link 58 and terminating at terminal node 24.

In steps 208 and 210, the paths identified in the step 206 may then be evaluated to determine whether the flow requirements for the associated flows are met by the design. More particularly, in step 208, a path may be selected for evaluation. Elements of the selected path are then identified. These elements may include, for example, each port, interconnect device and link encountered in the path. For each such element, the requirements for the flow that corresponds to the path through that element are aggregated along with requirements for other flows through that same element. These requirements may include, for example, the bandwidth and the number of ports required for the flows. For each selected path, its flow requirements are aggregated with those of other paths that were evaluated prior to the selected path. Then, in state 210, a determination is made as to whether the capacity of each element is exceeded by the aggregated requirements. This process is repeated for each flow and for each element of each flow.

In the example of FIG. 4, assume that each of interconnect devices 30-34 is a switch having a maximum bandwidth capacity of 100 Mb/s. Assume also that each of the interconnect devices 30-34 has four available ports and each port of the devices 30-34 has a maximum bandwidth capacity of 100 Mb/s. In addition, assume that each port of each of the source nodes 10-14 and each port of each of the terminal nodes 20-24 and each of the links 40-58 also has maximum bandwidth capacity of 100 Mb/s. Assume also that each of flows a-d and flows f-h require a bandwidth of 33 Mb/s and that flow e requires 0.5 Mb/s.

In a first pass through the step 208, the path for flow a may be selected. The bandwidth requirement for the flow a may then be associated with a port at the source node 10, the link 40, the device 30, the link 42 and a port at the terminal node 20. For example, this information may be saved in computer memory. In addition, the requirement of one port at the node 10 (shared by flows a, b and c), two ports (an entry port and an exit port) at the device 30 and one port at the node 20 may be recorded. Then, in the step 110, a determination may be made as to whether any of the bandwidth capacities of these elements is exceeded by the flow a and whether the number of available ports for each of these elements is exceeded by the flow a.

In a next pass through the step 208, the path for the flow b may be selected. Because the flow b uses the same port at the source node as the flow a, the bandwidth requirements for both flows are aggregated. The sum of these flow requirements may then be saved in the step 208 for comparison with capacity of the port at node 20 in the step 210. Similarly, the flow b also uses the link 40, and the same entry port at the device 30 that is used by the flow a. Thus, the bandwidth requirements of flow b for each of these elements can be aggregated with those of flow a. However, the flow b uses a different exit port at the device 30. Thus, the requirement of a third port at the device 30 may be recorded. Then, in the step 210, requirements of the flow b, aggregated with those of flow a, may be compared to the capacities of the corresponding elements of the network to determine whether any are exceeded.

While not used by the flow a, the link 44, the device 32, the link 50, the device 34, the link 58 and a port of the terminal node 22 are used by the flow b. Thus, in step 210, the requirements for the flow b at each of these elements may be compared to the capacities of the corresponding element to determine whether any are exceeded.

In this example, none of the capacities are exceeded by the flows a and b. For example, the device 30 has maximum input bandwidth capacity of 100 Mb/s, however, the total used by flows a and b is 66 Mb/s, which is less than the maximum. As another example, the device 30 has four ports, however, the flows a and b only require three ports at the device 30, which is less than the number of ports available.

In another pass through the step 208, the path for the flow c may be selected and its requirements aggregated with those of flows a and b. Thus, the requirements for the flow c may be aggregated with those of the other flows for each of the source node 10, the link 40, the device 30, the link 44, the device 32, the link 52 and the terminal node 24. Then, in step 210, the aggregated requirements for the flows a, b and c may be compared to the capacities of the corresponding elements of the network to determine whether any are exceeded.

The steps 208 and 210 may be repeated for each of the flows. In this manner, the additional requirements of each flow may be aggregated with the flows considered in previous passes through the step 208. In a final pass through the step 210, the aggregated requirements for all of the flows to be supported by the design may be compared the capacities of the corresponding elements of the network to determine whether any are exceeded.

In the embodiment described above, all of the flows are assigned to valid paths in the existing fabric design (step 206) and then the assignments are evaluated (steps 208-210) to determine whether the assignments are feasible (i.e. whether any constraints on elements in the fabric are violated).

In another embodiment, each flow is assigned to a valid path in the existing fabric design (step 206) and that assignment is evaluated for feasibility (steps 208 and 210) before step 206 is repeated, as indicated by the dotted line in FIG. 2. In this embodiment, the flows are assigned and evaluated one at a time. If the evaluation determines that an assignment is feasible, then a next flow is assigned in a next pass through the step 206. If an assignment is not feasible, then a different assignment may be attempted in the next pass through the step 206. If after repeated attempts, no feasible path is found for flow, then the design may be modified, as explained herein, to add one or more valid paths as needed, or to add one or more interconnect devices and associated links, or a new design may be developed.

In one aspect, the flows are examined in order of decreasing bandwidth, though another order could be used, such as increasing bandwidth, alternating between highest and lowest bandwidth (i.e. in order of: highest, lowest, next-highest, next-lowest, etc.), or random order. All feasible paths for a flow being examined may then be identified such that no bandwidth or other constraints would be violated if the flow were to be assigned to the path. The flow may then be assigned to one of the feasible paths.

For selecting among feasible paths for assigning a flow, the path that comes closest to violating a constraint (e.g., bandwidth) along the path may be chosen (This technique may be called "best fit," by contrast with other algorithms that could alternately be used, such as "first fit", in which the first feasible path found is chosen). For example, assume two paths are feasible for a flow, a first of which would result in a link being saturated by 75% (i.e. 25% of its total bandwidth is still available after the assignment) and a second of which would result in a different link being saturated by 95% (i.e. 5% of its total bandwidth is still available after the assignment). Assume also that these are the maximum saturation level for the paths, i.e. all other links in the first path have saturation no higher than 75% and all other links in the second path have saturation no higher than 95%. Then, the flow is assigned to the path that includes the link that would be saturated by a maximum of 95% since this is closer to exceeding the available bandwidth than the assignment which would result in a maximum of 75% saturation. It is expected that this technique will tend to assign flows so as to make the best or highest use of the available resources of the existing fabric design.

Once an attempt has been made to assign each flow to the existing design, such as after a final pass through the step 210, a determination is made in a step 104 (FIG. 1) as to whether all the flow requirements are successfully assigned to the fabric design. If all of the flows have been assigned to the existing fabric design without exceeding the capacities of the corresponding elements of the network design, then this indicates that modification of the design is not required in order to support the new flow requirements.

In the example, none of the capacities of elements of the network are exceeded by the requirements of the flows a-h. For example, the aggregated bandwidth requirement for the device 32 is 99.5 Mb/s. This includes 33 Mb/s for the flow b, 33 Mb/s for the flow c, 0.5 Mb/s for the flow e and 33 Mb/s for the flow f, resulting in a sum of 99.5 Mb/s. In addition, these flows require four ports at the device 32, two for entering flows and two for exiting flows. The maximum bandwidth capacity for the device 32 is 100 Mb/s and it has four ports. Accordingly, neither the bandwidth capacity, nor port number capacity of the device 32 is exceeded. Thus, the method 100 of FIG. 1 may terminate in step 106 after a no remaining flows determination in step 104.

In another example, assume that the flow e requires 10 Mb/s of bandwidth, rather than the 0.5 Mb/s previously assumed. In this case, the aggregated bandwidth requirements for the device 32 includes 33 Mb/s for the flow b, 33 Mb/s for the flow c, 10 Mb/s for the flow e and 33 Mb/s for the flow f, resulting in a sum of 109 Mb/s. This exceeds the maximum bandwidth available for the device 32, which is 100 Mb/s. Accordingly, a determination in the state 210 may be that the bandwidth capacity of the device 32 is exceeded. Flows that cause the capacity of an element of the interconnect fabric to be exceeded (in this example, the flow e) are not assigned to the interconnect fabric. Rather, these flows are held over so that modifications can be performed to the interconnect fabric for supporting them.

In addition, flows for which no valid path can be found in the existing fabric design are also held over. This includes flows for which for which there is not a path through the fabric between the source node for the flow and the terminal node for the flow. For example, this will occur where flow requirements specify a flow for which the source node or terminal node were not present in the initial fabric design.

If flows are held over, the determination in step 104 is that there are remaining flows. From step 104, an attempt is made in step 108 to modify the design by adding only one or more links in an attempt to accommodate any flows held over from step 102.

Note that in the examples above, the interconnect devices 30-34 are switches. Accordingly, communications for a flow that pass through one of these devices are passed from an entry port of the device to a specified exit port of the device. The bandwidth requirements for the flow may be aggregated (in step 208) along with other flows at the same input and exit ports to determine whether the maximum bandwidth capacity of either the input or exit port is exceeded. In addition, bandwidth requirements for the flow may be aggregated with all flows that enter the interconnect device to determine whether the maximum bandwidth capacity of the device is exceeded.

For other devices, such as hubs or repeaters, communications for a flow that enters a port of the device may be repeated at all other ports of the device, not just a specified exit port as in the case of switches. As a result, bandwidth consumed at one port to receive communications is also consumed at each other port in order to retransmit the communications and, because the communications are retransmitted, bandwidth is consumed at other devices in the fabric that receive these communications. Accordingly, the bandwidth requirement for a flow entering such a device is aggregated along with the bandwidth requirements for all the other flows entering the device to determine whether the bandwidth capacity of any port is exceeded. In addition, other devices that receive the repeated communications are examined to determine whether their bandwidth capacity is exceeded.

Figure 5:
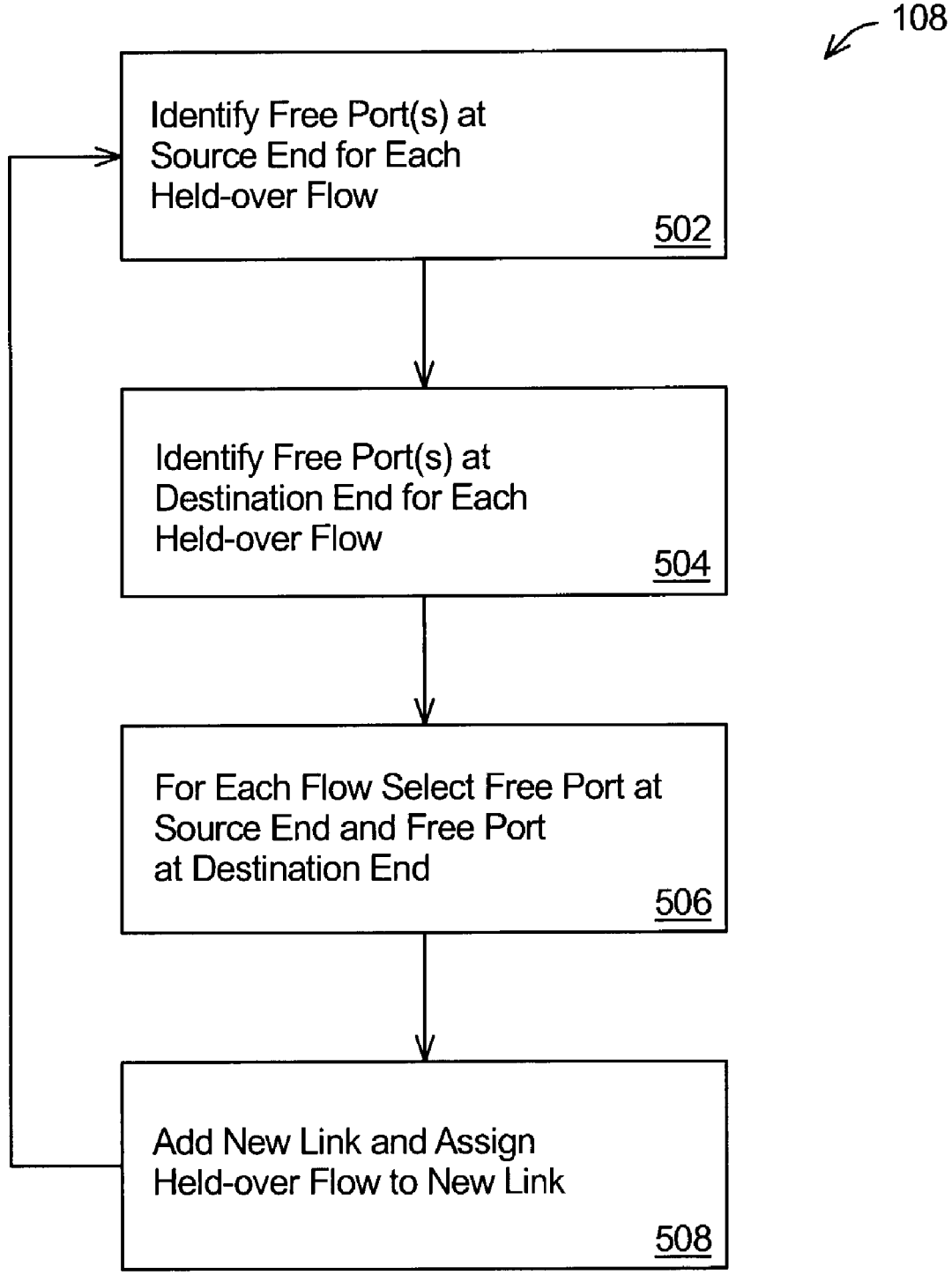
FIG. 5 shows a method for modifying a design for an interconnect fabric by adding only one or more links according to an aspect of the present invention.
Figure 6:
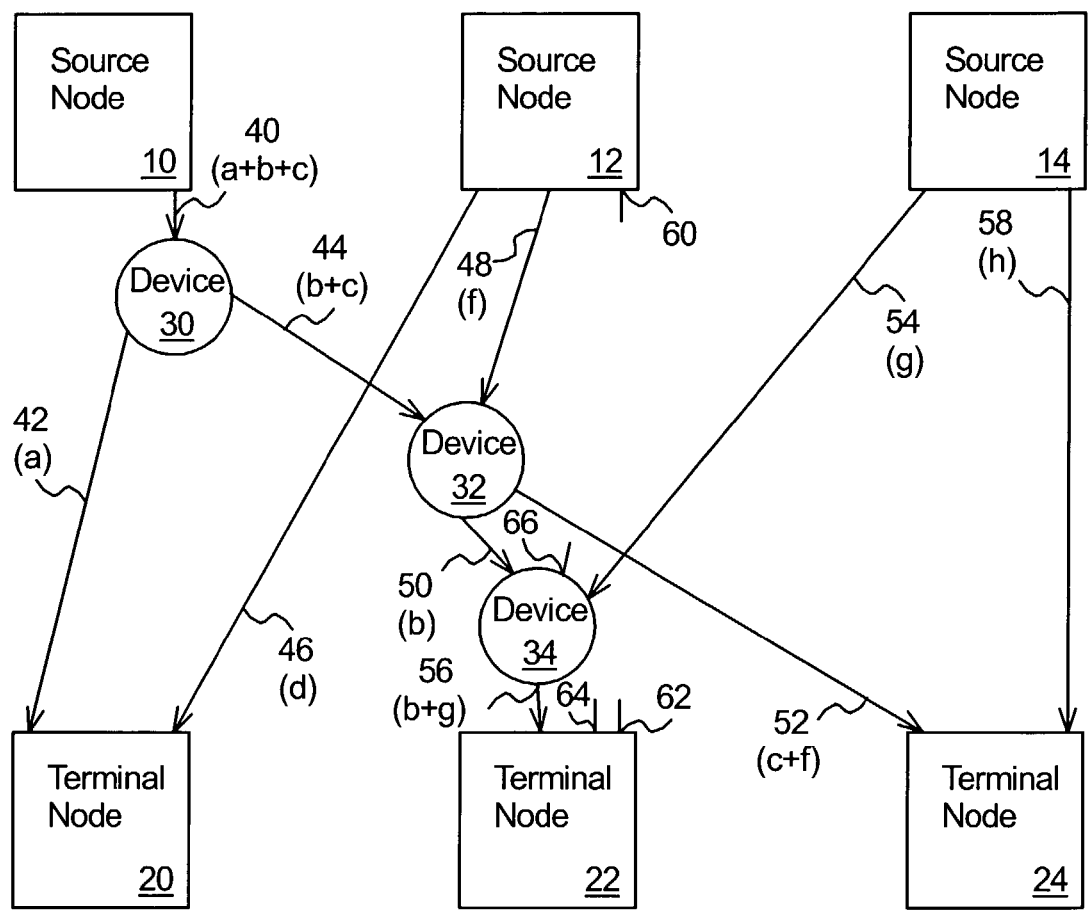
FIG. 6 shows an exemplary design for an interconnect fabric to which a link is to be added according to an aspect of the present invention.

In step 108 of FIG. 1, an attempt is made to accommodate flows held over from step 102 by adding only one or more links to the design. FIG. 5 illustrates an embodiment of the step 108 in more detail. In step 502 of FIG. 5, an attempt is made to identify any available ports for the source end of a held-over flow that have sufficient bandwidth capacity to accommodate the flow. In the example, assume that the source node 12 has at least three ports: one port connected to the link 46, one port connected to the link 48 and one port 60 that is available. The port 60 is shown in FIG. 6. Thus, in step 502, the port 60 may be identified. In other circumstances, more than one available port may be identified at the source node for the flow.

In addition to searching the source node for any available sports in step 502, an attempt may be made to locate any available ports at an interconnect device that is reachable from the source node by a path from the source node. Thus, any interconnect devices for which a path can be traced from the source node may be searched for any available ports. Such a path may include any number of ports and links, but needs to be feasible in that it provides sufficient bandwidth to accommodate the flow. In the example, the device 32 may be searched for available ports since a path can be traced from the node 12 to the device 32 via the link 48. However, in the example, the device 32 has only four ports, all of which are occupied. Accordingly, only one port (i.e. port 60) is identified in step 502 as being a feasible port for the flow. In other circumstances, multiple ports may be found in step 502.

In step 504, an attempt is made to identify any available ports for the destination end of a held-over flow that have sufficient bandwidth capacity to accommodate the flow. In the example, assume that the terminal node 22 has at least three ports: one port connected to the link 56, port 62 that is available and a port 64 that is available, as shown in FIG. 6. Similarly, an attempt may be made to locate an available port at an interconnect device from which a path can be traced to the terminal node. As shown in FIG. 6, device 34 has an available port 66 that from which the terminal node 22 can be reached. While the device 32 is reachable from the terminal node 22, the device 32 does not have an available port in the example.

In some cases, the flow requirements may specify a source or a terminal node that does not correspond to any paths in the initial interconnect fabric design. When this occurs, a source or a terminal node may be added to the design. For example, if a source node from which a flow is to originate cannot be identified in step 502, a new source node having at least one port with sufficient bandwidth for accommodating the flow may be added to the design in step 502. Similarly, where a terminal node for flow cannot be identified in step 504, a new terminal node having at least one port with sufficient bandwidth for the flow may be added to the design in step 504.

It will be apparent that steps 502 and 504 can be performed in another order or simultaneously. This search process may continue until all available ports are found that are reachable from the source end for the flow by a path with sufficient bandwidth to accommodate the flow and all available ports are found that are reachable from the terminal end by a path with sufficient bandwidth to accommodate the flow. The search may also end if no such port is found at either the source end or the terminal end for the flow.

Then, in step 506, for each flow, one of the ports identified in the step 502 is selected and one of the ports identified in the step 504 is selected. In the example, the port 60 is the only available port at the source end, while three ports 62, 64 and 66 are available at the terminal end. Thus, one of the ports 62, 64 or 66 is selected.

Figure 7:
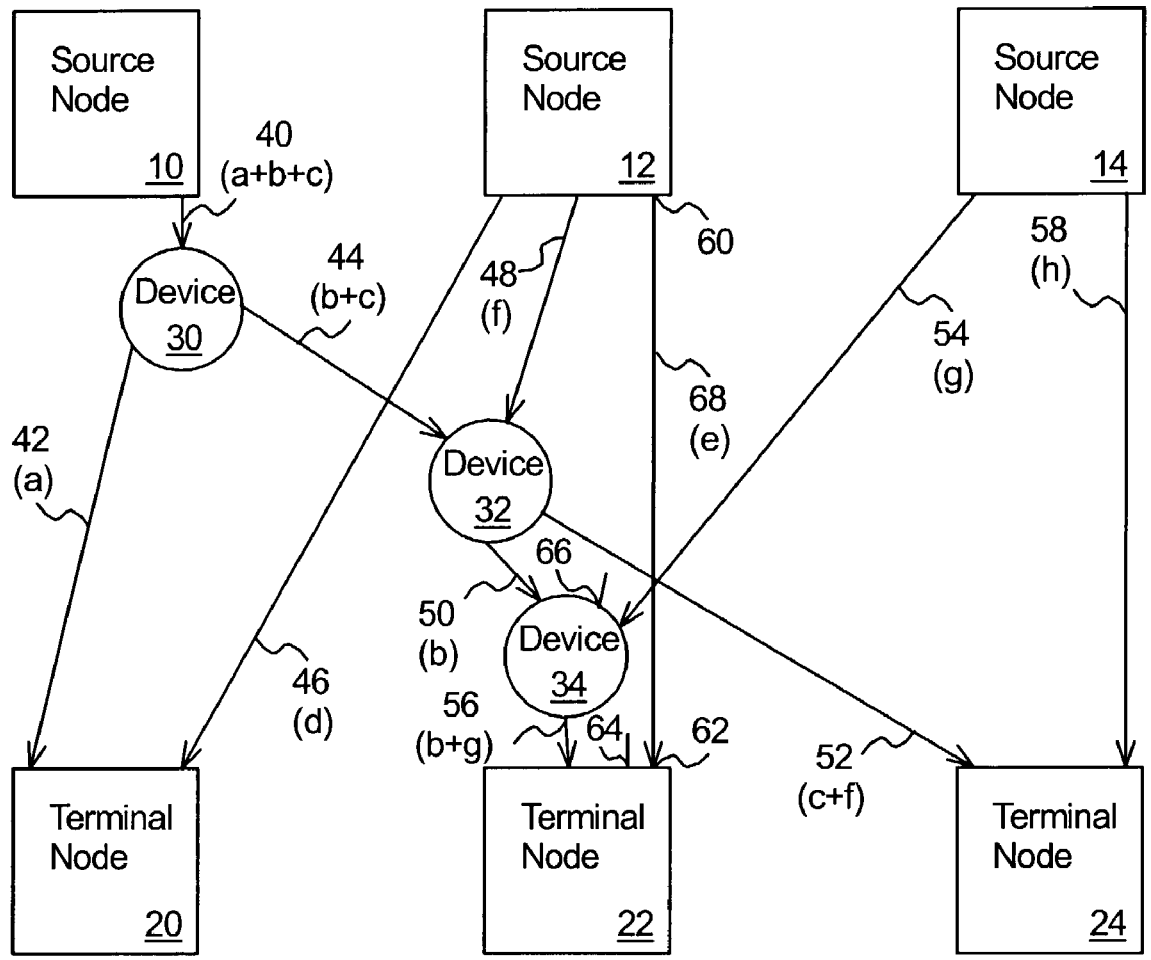
FIG. 7 shows an exemplary design for an interconnect fabric to which a link is has been added according to an aspect of the present invention.
Figure 8:
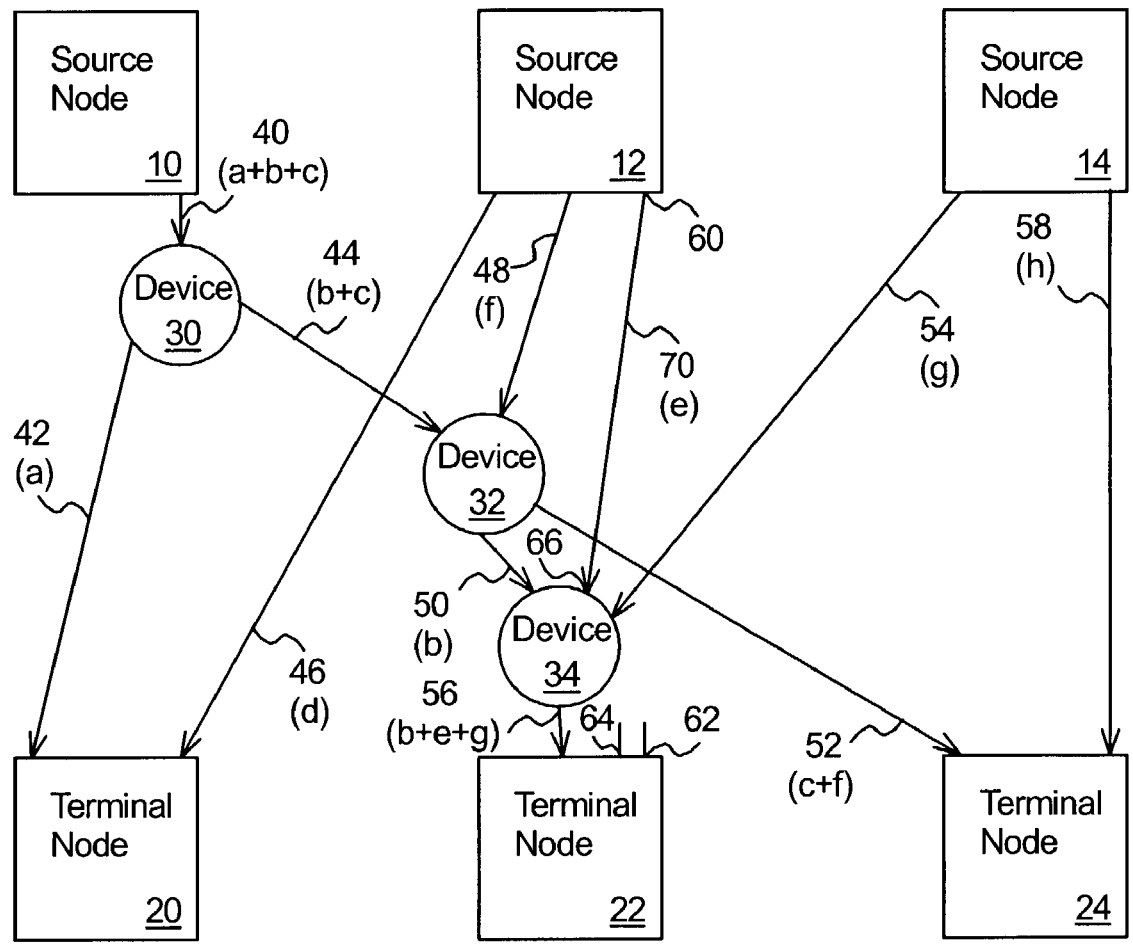
FIG. 8 shows an alternate exemplary design for an interconnect fabric to which a link has been added according to an aspect of the present invention.

In step 508, a new link is added to route the flow from the source node to the terminal node using the ports selected in step 506 and the held-over flow is assigned to the newly added link. In the example, a link 68 may be added to connect the port 60 at the source node 22 to the port 62 at the terminal node 22, as is shown in FIG. 7. Alternately, as shown in FIG. 8, a link 70 may be added to connect the port 60 at the source node to port 66 at the device 34. Also in step 508, the other held-over flows not yet assigned to a path may be examined to determine whether any of those flows can also be assigned to the newly-added link, thus, removing them from the group of held-over flows. This process (steps 506-508) may then be repeated for each additional flow held over from step 102 of FIG. 1.

In one aspect, where an attempt is made to assign multiple flows to the fabric design in steps 506 and 508, the flows are examined in order of decreasing bandwidth, though another order could be used, such as increasing bandwidth, alternating between highest and lowest bandwidth (i.e. in order of: highest, lowest, next-highest, next-lowest, etc.), or random order.

The number of available ports at the source end to which a given flow could feasibly be assigned may be given as Ps, while the number of available ports at the terminal end to which the flow could feasibly be assigned may be given as Pt. Accordingly, the number of possible links L is the product of Ps and Pt (L=Ps×Pt). In one aspect, the product of Ps and Pt is computed for each flow and the flows are attempted to be assigned to the fabric design (in steps 506 and 508) in increasing order of the value of L. Thus, flows having the fewest possible links are assigned before those having greater possibilities. This is expected to increase the likelihood of assigning a greater number of flows to the fabric design in steps 506 and 508.

While the product of Ps and Pt indicates the precise number of possible links, other techniques may be used for prioritizing flows based on Ps and Pt. For example, flows may be prioritized according to a sum of Ps and Pt, the sum also being representative of the number of possible links.

To select from among the possible links for a flow, links are preferred that can accommodate the greatest number of flows. For example, assume that any of four links, given as link1, link2, link3 and link4, would accommodate a flow, given as flow 1, and there are other flows flow2, flow3 and flow4 to be assigned to the fabric design, a table may be formed as follows:

| Flow | flow1 | flow2 | flow3 | flow4 |
|---|---|---|---|---|
| Feasible Links | link2, link3 | link1, link4 | link2, link4 | link1, link2 |

In this example, link2 would accommodate the greatest number of flows, which is three (i.e. flow1, flow3 and flow4) and, thus, link2 preferred over the others. Thus, the link2 may be added and flow1, flow3 and flow4 may each be assigned to the link in step 508.

As links are added to the fabric design, this will tend to reduce the number of available ports for adding additional links. Thus, program flow may return to step 502 from 508. In this way, Ps and Pt may be recomputed after each new link is added. Alternately, to reduce the number of computations, Ps and Pt may be recomputed periodically (e.g., only after a specified number of links have been added to the design).

From step 108 of FIG. 1, a determination is made in step 110 as to whether any flows held over from step 102 still remain. If all such flows have been successfully accommodated by the addition of links only in step 108, this indicates that no further modification to the design is required in order to reprovision the design for supporting the new flow requirements. Thus, the method 100 of FIG. 1 may terminate in step 106 after such a determination in step 104.

Figure 9:
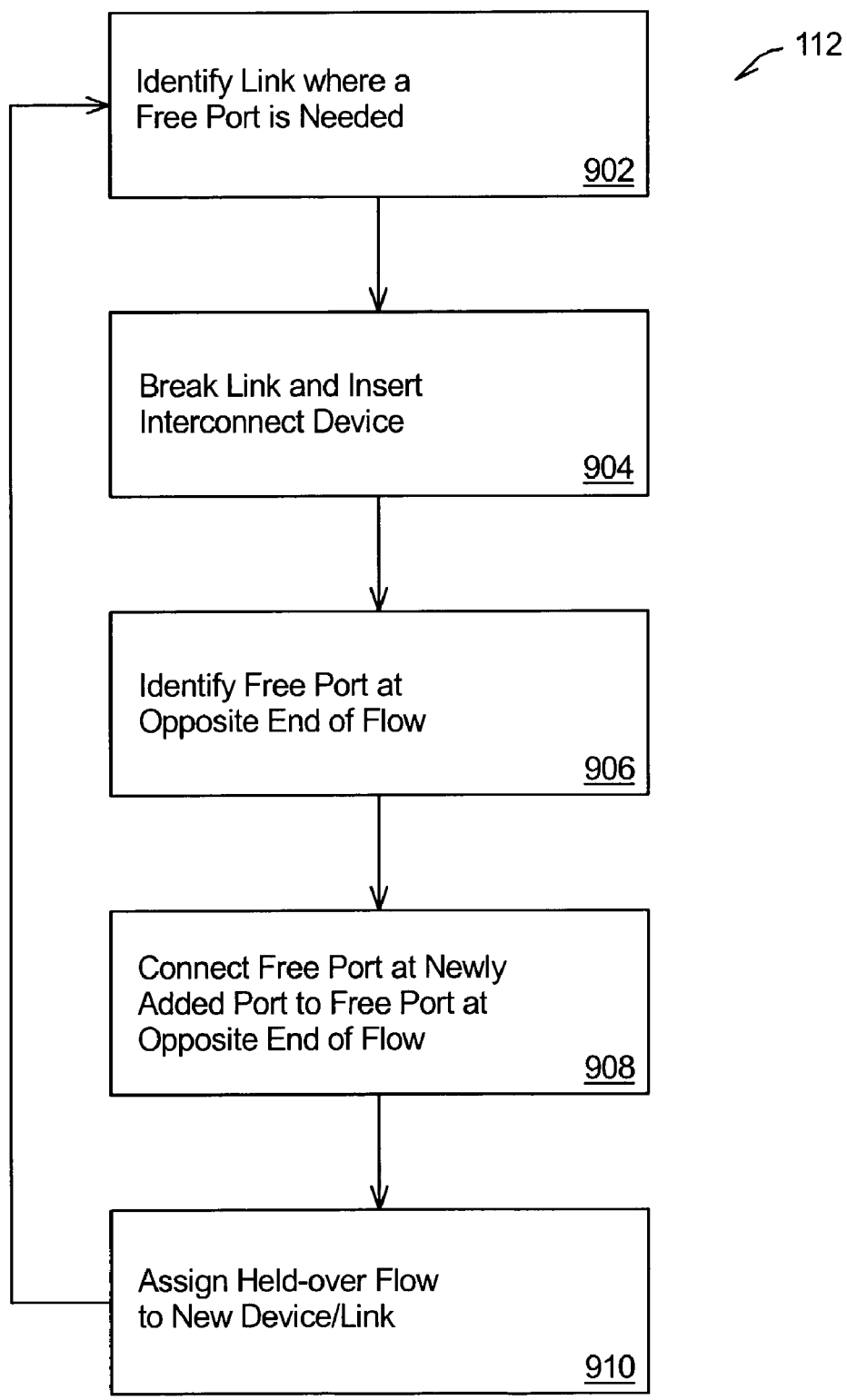
FIG. 9 shows a method for modifying a design for an interconnect fabric by adding one or more interconnect devices according to an aspect of the present invention.

However, if one or more flows were not successfully assigned in step 108, any such flows are held over to step 112. In step 112, an attempt is made to modify the design by adding one or more interconnect devices and associated links in an attempt to accommodate any flows held over from step 108. FIG. 9 illustrates the step 112 in more detail.

Generally, flows cannot be assigned in step 108 where no available port is located for adding a link at the source end of the held-over flow or at the destination end of the held-over flow. For example, returning to the example of FIG. 4 where the flow e requires 10 Mb/s of bandwidth and, thus, the aggregated bandwidth requirements for the device 32 exceeds the maximum bandwidth available for the device 32. As a result, the flow e could not be assigned in the step 102. Assume also that the source node 12 has only two ports. In that case, the flow e may held-over from step 108 because no port is available for the flow at the node 12 and the flow cannot feasibly be assigned to the device 32.

Thus, in step 902 of FIG. 9, a link at a node or device for which an available port is needed for accommodating a flow, but is not available, is identified. In the example in which the node 12 has only two ports and the flow e is 10 Mb/s, a port is needed at the node 12 in order to accommodate the flow e, but none is available.

Figure 10:
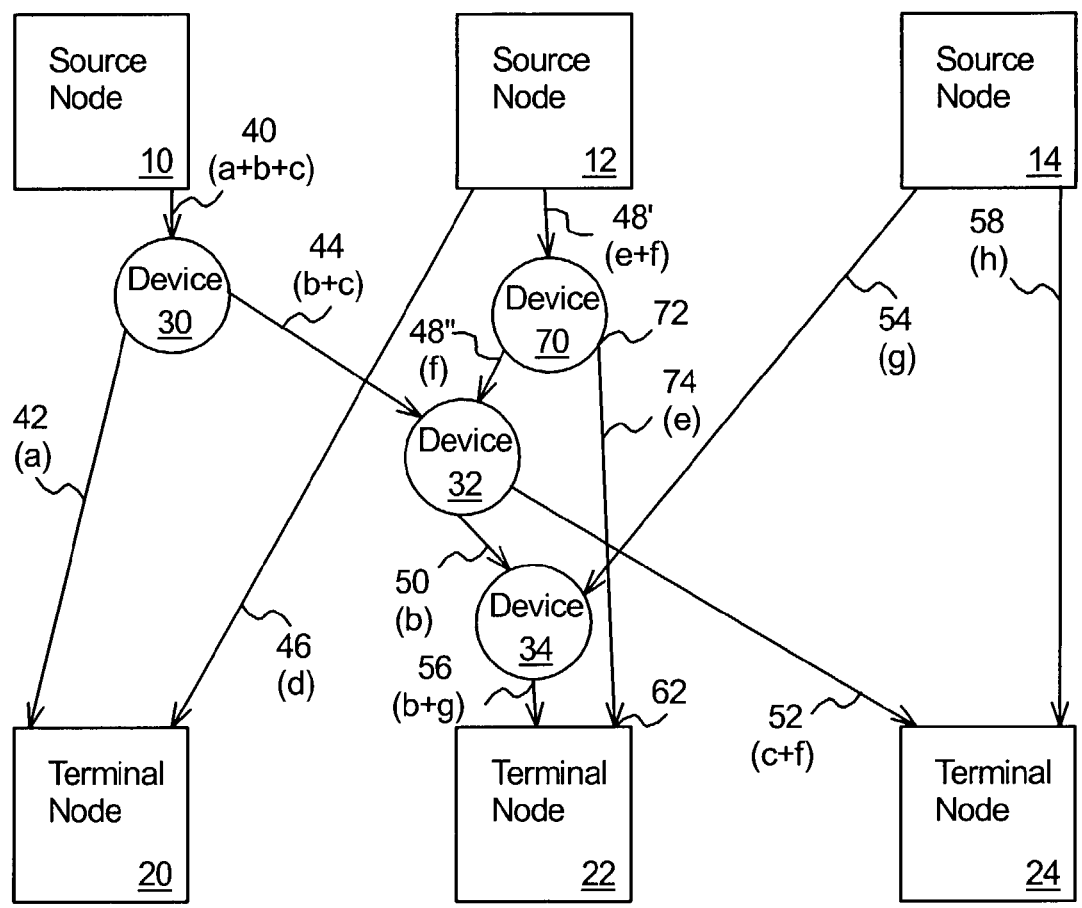
FIG. 10 shows an exemplary design for an interconnect fabric to which a node and associated link have been added according to an aspect of the present invention.

Then, in step 904, the link is broken (i.e. disconnected) and an interconnect device having at least three ports is inserted into the link. This is shown in FIG. 10 where the link 48 of FIG. 4 is broken into two pieces 48' and 48" and an interconnect device 70 is inserted into the link 48. Because the inserted device has at least three ports and two ports are required to connect the device to the broken link, at least one port is available. In the example, two of the ports of the device 70 are connected to each of the two pieces of the broken link 48. Thus, the device 70 has an available port 72.

In step 906, an available port at the end of the flow opposite to the newly provided port is identified. In steps 902-904 for the example, the port 72 was made available at the source end of flow e in by the addition of the device 70. Thus, in step 906 an available port may be identified at the destination end of the flow e. In the example, the port 62 was found to be available at the terminal node 22 (in step 504 of FIG. 5). If an available port was not located in step 906, the steps 902 and 904 may be performed at each end of the flow, as necessary and if feasible, to insert an interconnect device and thereby provide an available port.

In step 908, if at least one available port at the source end and one available port at the destination end have been identified, then a link is added connecting the ports. Thus, in the example, a link 74 may be added to connect the ports 72 and 62. This is shown in FIG. 10. If multiple ports are identified, then one may be selected in the manner described above relative to steps 506 and 508 of FIG. 5 for selecting pairs of ports and a link to be added between the pair of ports.

In step 910, the held-over flow is assigned to the newly added link. Thus, in the example, the flow e may be assigned to the link 74. Also in step 910, the other held-over flows not yet assigned to a path may be examined to determine whether any of those flows can also be assigned to the newly-added interconnect device, thus, removing them from the group of held-over flows. Then, this process (steps 902-910) may be repeated for each additional flow held over from step 112 of FIG. 1.

In an alternate embodiment, the step 102 of FIG. 1, and optionally, both of steps 102 and 108, may be performed using integer programming techniques. This may be accomplished by using the existing interconnect fabric design and the flow requirements to be supported by the design to initialize an integer programming problem. The integer programming problem is then solved in an attempt to assign each flow of the new flow requirements to a valid and feasible path in the existing interconnect fabric design.

The integer programming problem is initialized in terms of decision variables, constraints, and objectives. The decision variables include whether or not a flow F, is to be assigned to a particular interconnect element, such as link L or an interconnect device. Thus, for example, each possible combination of a flow and link given as {F, L} represents a decision variable. A value of one may be assigned to such a decision variable to indicate the flow is assigned to the link or a value of zero may be assigned to indicate the flow is not assigned to the link. Another decision variable may be whether or not a new link is to be added between a pair of available (i.e. open) ports (assuming step 108 is also to be performed by integer programming). Possible available ports may be on a node or interconnect device. Another decision variable may be whether to remove an existing link in the design.

The constraints include a requirement that a flow can only be assigned to a set of links and devices that form a valid path for the flow (or to a path that would become a valid path for the flow by the addition of one or more links).

The constraints also include maximum bandwidth constraints, such as bandwidth constraints on communication links, on ports of interconnect devices and on ports of nodes. Thus, a flow cannot be assigned to a path if the assignment would violate a bandwidth or other constraint on any of the links or devices in the path, even where the path is a valid path for the flow. To determine whether a bandwidth constraint for a network resource is violated, the bandwidth requirements for all flows that utilize the resource are aggregated.

A constraint for adding links is the number of ports available at the node or device that terminates each end of the link, since each link to be added requires an open port at each of its ends. Thus, for adding a link to accommodate a flow, a pair of available ports are selected, including an available port that is reachable from the source node for the flow and an available port that is reachable from the terminal node for the flow.

The objectives include maximizing the assignment of flows (e.g., by number of flows, total bandwidth assigned, or a combination of both) to valid and feasible paths in the existing interconnect fabric and may also include minimizing cost. Taking both of these objectives into account may be accomplished, for example, by selecting a least-cost solution to the integer programming problem from among several solutions that result in a high assignment of flows to the existing design. Alternately, a weighted sum that includes components of each may be maximized, e.g., (a f(x)+b g(x)) where a and b are multiplicative weights on the functions f and g and the functions f and g relate to assignment of flows and cost, respectively.

Thus, the decision variables, constraints and objectives define a search space within which any and all solutions to the integer programming problem can be found.

Solving the integer programming problem is accomplished by an exhaustive search of the search space for solutions that do not violate any of the constraints. Each solution is represented as a set of values for the decision variables. Thus, each solution specifies flows that are assigned to paths in the initial interconnect fabric. A path may include one or more newly-added links.

The integer programming may be performed by using a commercially available modeling language, such as AMPL available from AMPL Software Pty. Ltd. of Turramurra, Australia and a commercially available integer programming solver, such as CPLEX available from ILOG S. A. of Gentilly, France. It will be apparent, however, that a different modeling language and/or solver may be used.

From step 112 of FIG. 1, a determination is made in step 114 as to whether any flows held over from step 112 still remain. If all such flows have been successfully accommodated by the addition of interconnect devices and associated links in step 112, this indicates that no further modification to the design is required in order to reprovision the design for supporting the new flow requirements. Thus, the method 100 of FIG. 1 may terminate in step 106 after such a determination in step 114.

As explained above, an attempt is made to add one or more links (in step 108 of FIG. 1) to accommodate unassigned flows and, then, an attempt is made to add one or more interconnect devices (in step 112 of FIG. 1). However, in some circumstances, one or more interconnect devices may be added (as in step 112) and, then, one or more additional links may be added (as in step 108). For example, where an interconnect device that is newly added in step 112 has more than one port available, attempts to accommodate unassigned flows by adding new links to those available ports may be made before any additional interconnect devices are added.

If one or more flows were not successfully assigned in steps 108 or 112, this indicates that the addition of links and interconnect devices is insufficient to reprovision the design to support the new flow requirements. Accordingly, even more disruptive modifications than previously attempted are likely to be required to appropriately reprovision the fabric design.

In one aspect, the original fabric design is redesigned in step 116. Thus, in step 116 rather than modify the original design, a new design is developed from scratch. Any of a number of programmatic techniques may be utilized to redesign the fabric in step 116. For example: U.S. application Ser. No. 09/707,227, filed Nov. 6, 2000; U.S. application Ser. No. 09/968,437, filed Sep. 28, 2001; and U.S. application Ser. No. 10/027,564, filed, Dec. 19, 2001, the contents of each of which are hereby incorporated by reference, each disclose a technique for designing interconnect fabrics using a set of nodes and flow requirements as a starting point.

In another aspect, a physical embodiment of the original design may be assumed to be available. Thus, for redesigning the fabric in step 116, it may be desired to reuse physical elements of the existing network in order to reduce the cost of reprovisioning the network. Thus, for designing the interconnect fabric in step 116, a cost may be assigned to each of various elements available for inclusion in the design. When selecting from two or more possible options for the design having different costs, the lower cost of the options may then be selected in an effort to reduce the cost of the overall design. U.S. application Ser. No. 10/027,564, filed Dec. 19, 2001, and incorporated herein by reference, discloses a technique for designing interconnect fabrics in which cost of fabric elements may be taken into account when designing the network. In addition, U.S. application Ser. No. 09/968,437, filed Sep. 28, 2001 and incorporated herein by reference, discloses a technique for designing interconnect fabrics in cost of modules accounts for the relative cost of links, hubs and switches and in which modules are built by low-cost selection. Thus, in the redesigning step 116, a lower cost (e.g., zero cost) may be assigned to interconnect devices or links existing in the original fabric design than to alternates not included in the design. As a result, the elements existing in the design will tend to be favored over other elements not included in the design, thereby tending to reduce the cost of the reprovisioned network design by reusing the devices.

In general, an attempt is made to modify the design by adding only links to the design before interconnect devices are added. However, this is not necessary. For example, in some circumstances, it may be preferred to add one or more interconnect devices before attempting to assign all held-over flows to newly added links. Similarly, an attempt is made to modify the original design by adding links and/or interconnect devices before the redesigning the fabric (step 116). This too, is not necessary. For example, it may be desired to redesign the interconnect fabric even where the original design can be successfully modified by the addition of links only with or without the addition of interconnect devices. In that case, two or more alternate solutions may be obtained and a preferred one is selected. For example, in some circumstances, the preferred design is one that is expected to take the least time to implement. In other circumstances the preferred design is one that is expected to provide shortest network latencies.

Figure 11:
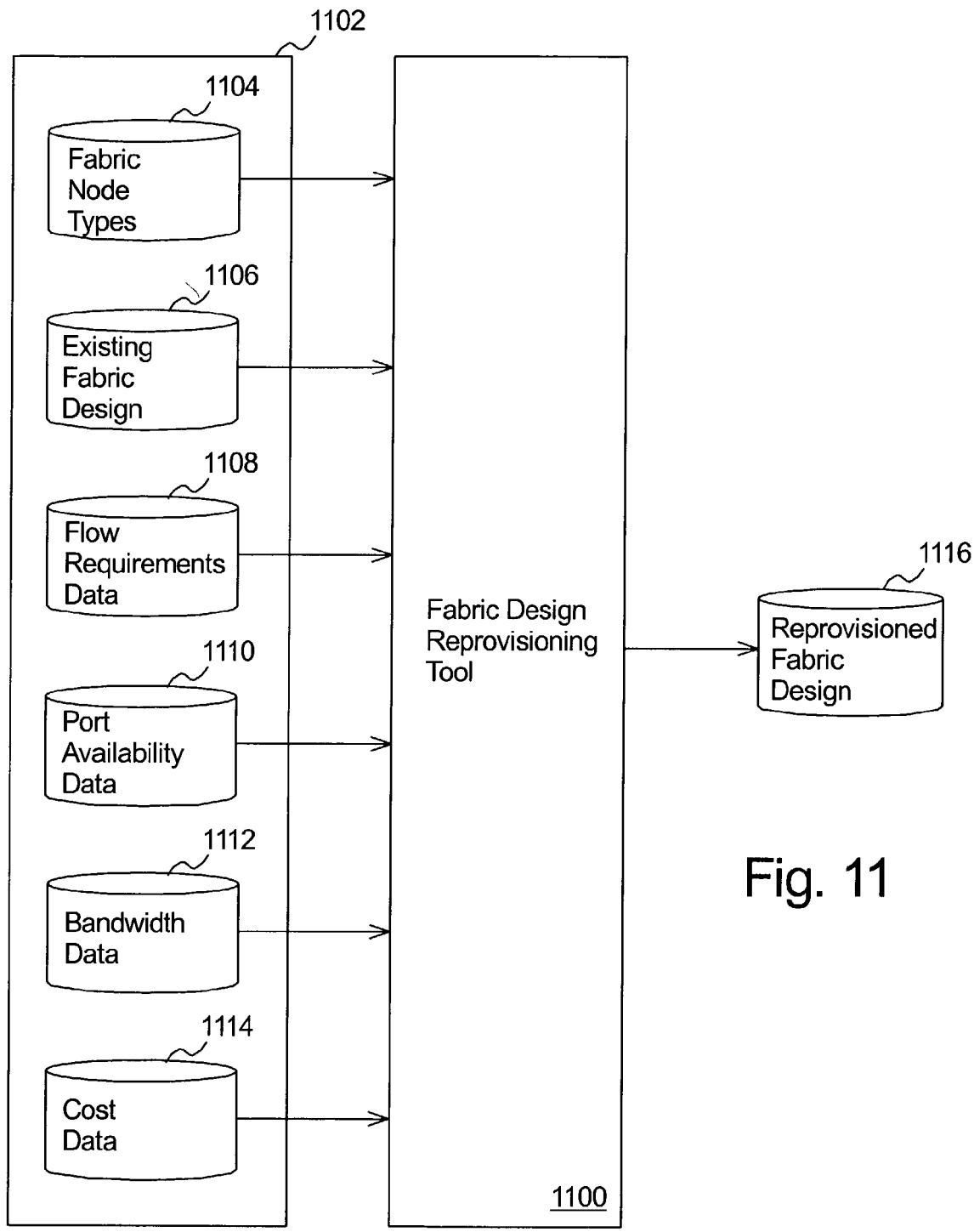
FIG. 11 shows a system having a fabric design reprovisioning tool that may be used to reprovision a design for an interconnect fabric in accordance with an aspect of the present invention.

FIG. 11 shows a system having a fabric design reprovisioning tool 1100 that may employ the method 100 of FIG. 1 (and the methods of FIGS. 5 and 9) to reprovision a design for an interconnect fabric. The fabric design reprovisioning tool 1100 may be implemented in computer software and/or hardware to perform its functions. Thus, the tool may include machine-readable media (e.g., a floppy disk, compact disk or hard disk) that includes a sequence of machine-executable instructions according to which the methods herein may be performed. Design information 1102 input to the tool 1100 in one embodiment includes a list of hosts (source nodes) and devices (terminal nodes) 1104, a interconnect specification for an existing design 1106, a set of flow requirements data to be supported by the reprovisioned design 1108, a set of port availability data 1110 and a set of bandwidth data 1112. The design information 1102 may be stored in an information store, such as a file or set of files or a database, etc.

The list of hosts and devices 1104 may specify the hosts and devices that are to be interconnected by a reprovisioned interconnect fabric design 1116. This list 1104 may be obtained in step 202 of FIG. 2.

The interconnect fabric design specification 1106 may specify the original interconnect fabric design to be reprovisioned. The design specification 1106 may be obtained in the step 204 of FIG. 2.

The flow requirements data 1108 may specify the desired flow requirements for the reprovisioned interconnect fabric design 1116. The desired flow requirements may include bandwidth requirements for each pairing of the source and terminal nodes and may be obtained in the step 202 of FIG. 2.

The port availability data 1110 may specify the number of communication ports available on each source node and each terminal node and each available interconnect device. This information may be used to determine feasibility of assigning flows to paths (e.g., in steps 208-210 of FIG. 2).

The bandwidth data 1112 may specify the bandwidth of each host and device port and each type of fabric node and link. The bandwidth data may also specify maximum bandwidth for entire interconnect devices. This information may also be used to determine feasibility of assigning flows to paths (e.g., in steps 208-210 of FIG. 2).

Reprovisioned fabric design result 1116 generated by the fabric design reprovisioning tool 1100 specifies a reprovisioned fabric design based on the original design 1106 that is intended to satisfying the flow requirements 1108.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A computer implemented method for reprovisioning an initial design for an interconnect fabric thereby forming a reprovisioned design, the initial design including an arrangement of interconnect elements for interconnecting a plurality of network nodes and the reprovisioned design having requirements for a plurality of flows among the network nodes the method comprising:

attempting to associate each of the plurality of flows with a feasible path for the flow through the interconnect fabric;

for each of a plurality of the flows not successfully associated with any feasible path, searching for available ports that are reachable from a source node for the flow via feasible paths in the interconnect fabric and searching for available ports that are reachable from a terminal node for the flow via feasible paths in the interconnect fabric, each pair of an available port reachable from the source node via a feasible path for the flow and an available port reachable from the destination node via a feasible path for the flow providing for a possible link for the flow between the pair of the available ports; and computing a value that is representative of a number of possible links for accommodating each of the plurality of flows that are not successfully associated with any feasible path, the value for at least one of the flows being greater than one, and selecting a flow for receiving a new link, the flow being selected from among the plurality of flows that are not successfully associated with a feasible path according to the value computed for each flow.

2. The method according to claim 1, wherein the value that is representative of the number of possible links is a product of the number of available ports that are reachable from the source node for the flow and the number of available ports that are reachable from the terminal node for the flow.

3. The method according to claim 1, wherein the flow having a lower value that is representative of the number of possible links is selected for adding a new link prior to flows having a higher number of possible links.

4. The method according to claim 1, further comprising selecting from among the possible links for the flow by determining a number of flows that are feasible to associate with the newly added link.

* * * * *

UNITED STATES PATENT AND TRADEMARK OFFICE
CERTIFICATE OF CORRECTION

PATENT NO. : 7,308,494 B1 Page 1 of 1
APPLICATION NO. : 10/290760
DATED : December 11, 2007
INVENTOR(S) : Julie Ward Drew et al.

It is certified that error appears in the above-identified patent and that said Letters Patent is hereby corrected as shown below:

In column 10, line 8, delete "sports" and insert -- ports --, therefor.

Signed and Sealed this

Third Day of June, 2008

JON W. DUDAS
*Director of the United States Patent and Trademark Office*